US010661305B2

(12) United States Patent
Liao et al.

(10) Patent No.: US 10,661,305 B2
(45) Date of Patent: May 26, 2020

(54) FILM PRODUCTION METHOD AND SYSTEM

(71) Applicant: BOE TECHNOLOGY GROUP CO., LTD., Beijing (CN)

(72) Inventors: Chinlung Liao, Beijing (CN); Guang Yan, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 226 days.

(21) Appl. No.: 15/841,152

(22) Filed: Dec. 13, 2017

(65) Prior Publication Data

US 2018/0318875 A1    Nov. 8, 2018

(30) Foreign Application Priority Data

May 5, 2017    (CN) .......................... 2017 1 0313249

(51) Int. Cl.
*B05D 3/00* (2006.01)
*B05D 1/02* (2006.01)
(Continued)

(52) U.S. Cl.
CPC .............. *B05D 3/007* (2013.01); *B05D 1/02* (2013.01); *B05D 3/02* (2013.01); *B05D 3/0254* (2013.01);
(Continued)

(58) Field of Classification Search
CPC . B05D 1/02; B05D 3/12; B05D 3/007; B05D 3/06; B05D 3/065; B05D 3/02; B05D 3/0254; B05D 3/0466; H01L 21/02104; H01L 21/64; H01L 21/67; H01L 21/67017; H01L 21/67092; H01L 21/6715; H01L 27/32; H01L 51/50; H01L 51/5012; H01L 51/0003; H01L 51/56
(Continued)

(56) References Cited

U.S. PATENT DOCUMENTS 7,353,623 B2 *  4/2008  Asuke .................... F26B 11/18
                                                          34/381
7,786,670 B2     8/2010  Veres et al.
(Continued)

FOREIGN PATENT DOCUMENTS

CN    1380839 A    11/2002
CN    1794099 A    6/2006
(Continued)

OTHER PUBLICATIONS

Chinese Office Action issued in related Chinese Application No. 2017103132491 dated May 3, 2018 (with English translation).

*Primary Examiner* — William P Fletcher, III
(74) *Attorney, Agent, or Firm* — McDermott Will & Emery LLP

(57) ABSTRACT

The film production method includes: forming an ink layer on the base substrate covering the surface of the base substrate, the ink layer including a solvent and a film-forming material dissolved in the solvent; blowing gas to the ink layer so that the solvent in the ink layer spreads towards the periphery of the base substrate; removing the solvent in the ink layer so that the film-forming material in the ink layer forms a film covering the surface of the base substrate.

10 Claims, 3 Drawing Sheets

(51) Int. Cl.
- *B05D 3/12* (2006.01)
- *B05D 3/06* (2006.01)
- *B05D 3/04* (2006.01)
- *H01L 21/32* (2006.01)
- *H01L 21/67* (2006.01)
- *H01L 51/50* (2006.01)
- *H01L 51/56* (2006.01)
- *H01L 21/02* (2006.01)
- *H01L 21/64* (2006.01)
- *B05D 3/02* (2006.01)
- *H01L 51/00* (2006.01)

(52) U.S. Cl.
CPC ............. *B05D 3/0466* (2013.01); *B05D 3/06* (2013.01); *B05D 3/065* (2013.01); *B05D 3/12* (2013.01); *H01L 21/02104* (2013.01); *H01L 21/32* (2013.01); *H01L 21/64* (2013.01); *H01L 21/6715* (2013.01); *H01L 21/67017* (2013.01); *H01L 21/67092* (2013.01); *H01L 51/50* (2013.01); *H01L 51/5012* (2013.01); *H01L 51/56* (2013.01); *H01L 51/0003* (2013.01)

(58) Field of Classification Search
USPC ....... 427/64, 66, 77, 348, 384, 427.4; 347/1, 347/101, 102; 118/56, 63, 300; 257/E51.022; 428/917
See application file for complete search history.

(56) References Cited

U.S. PATENT DOCUMENTS

| | | |
|---|---|---|
| 2002/0186287 A1 | 12/2002 | Kawase |
| 2006/0137213 A1 | 6/2006 | Asuke |
| 2008/0024548 A1* | 1/2008 | Shang .................. B41J 2/16552 347/25 |
| 2017/0036461 A1 | 2/2017 | Hu et al. |
| 2017/0057249 A1 | 3/2017 | Dai et al. |
| 2017/0213966 A1 | 7/2017 | Wang et al. |

FOREIGN PATENT DOCUMENTS

| | | |
|---|---|---|
| CN | 104786656 A | 7/2015 |
| CN | 104859291 A | 8/2015 |
| CN | 104908423 A | 9/2015 |

* cited by examiner

FILM PRODUCTION METHOD AND SYSTEM

CROSS-REFERENCE TO RELATED APPLICATION

This application claims priority to Chinese Patent Application No. 201710313249.1 filed on May 5, 2017, titled "FILM MAKING METHOD AND SYSTEM", which is incorporated herein by reference in its entirety.

TECHNICAL FIELD

The present disclosure relates to the technical field of film production, more particularly, to a film production method and system.

BACKGROUND

Organic Light Emitting Diode (OLED) display devices are widely used in display technologies due to their advantages of self-luminous, fast response, wide viewing angle, high brightness and bright color.

SUMMARY

The embodiments of the present disclosure provide a film production method, including:

forming an ink layer on a base substrate covering the surface of the base substrate, the ink layer including a solvent and a film-forming material dissolved in the solvent;

blowing gas to the ink layer, so that the solvent in the ink layer spreads towards the periphery of the base substrate;

removing the solvent in the ink layer, so that the film-forming material in the ink layer forms a film covering the surface of the base substrate.

Optionally, the viscosity of the ink layer is about 1 cP to 20 cP.

Optionally, the blowing gas to the ink layer so that the solvent in the ink layer spread towards the periphery of the base substrate includes: blowing gas to the ink layer, so that the solvent in the ink layer spreads from the geometric center of the base substrate towards the periphery of the base substrate.

Optionally, the forming an ink layer on the base substrate covering the surface of the base substrate includes: forming, through ink-jet printing, the ink layer on the base substrate covering the surface of the base substrate.

Optionally, when blowing gas to the ink layer, the gas flow rate is about 0.1 m/s to 10 m/s, and the duration time of the gas blowing is about 300 s to 400 s.

Optionally, the film production method, before the forming an ink layer covering the surface of the base substrate on the base substrate, further includes: placing the base substrate in a film process chamber. The film production method, after the blowing gas to the ink layer so that the solvent in the ink layer spread towards the periphery of the base substrate, and before removing the solvent in the ink layer, further includes: extracting out the gas with the solvent from the film process chamber.

Further optionally, the extracting the gas with the solvent from the film process chamber includes: extracting the gas with the solvent from the film process using a gas extraction device arranged along the circumferential direction of the base substrate.

Optionally, the removing the solvent in the ink layer so that the film-forming material in the ink layer forms a film covering the surface of the base substrate includes: heating the ink layer by using a hot plate to heat the ink layer, or using hot gas to heat the ink layer, or using microwave to heat the ink layer or using infrared to heat the ink layer, so that the film-forming material in the ink layer forms a film covering the surface of the base substrate.

The embodiments of the present disclosure also provide a film production system for carrying out the film production method of claim 1, including a printing device, a gas blowing device and a drying device, wherein the printing device is configured to form the ink layer on the base substrate covering the surface of the base substrate, the ink layer including the solvent and the film-forming material dissolved in the solvent.

The gas blowing device is configured to blow gas to the ink layer, so that the solvent in the ink layer spreads towards the periphery of the base substrate.

The drying device is configured to remove the solvent in the ink layer, so that the film-forming material in the ink layer forms the film covering the surface of the base substrate.

Optionally, the printing device is an inkjet printing device.

Optionally, the drying device includes one or a combination of two or more of a hot plate heating device, a hot gas heating device, a microwave heating device and an infrared heating device.

Optionally, the film production system further includes a film process chamber and a gas extraction device, the gas extraction device and the base substrate are located in the film process chamber, and the gas extraction device is arranged along the circumferential direction of the base substrate The gas extraction device is configured to extracting out the gas with solvent from the film process chamber.

Further optionally, the gas extraction device is a vacuum pump.

BRIEF DESCRIPTION OF THE DRAWINGS

The drawings described herein are used to provide a further understanding of the present disclosure, and constitute a part of the disclosure. The schematic embodiments of the disclosure and the descriptions thereof are used to explain the disclosure, and do not constitute improper limitations to the disclosure. In the drawings.

DETAILED DESCRIPTION

In order to further explain the film production method and the system provided in the embodiments of the present disclosure, the details are described below with reference to the accompanying drawings.

There is a kind of OLED display devices that includes an anode, an organic functional layer, and a cathode sequentially formed on the base substrate. The organic functional layer needs to be made by a film production process. In various film-forming processes, an organic functional layer material as a solute should be mixed with a solvent firstly, and the mixed liquid is coated on a base substrate, and secondly the coated base substrate is dried to obtain a film composed of the organic functional layer material coating on the base substrate. However, during the above drying process, since the liquid located in the middle of the base substrate is surrounded by the liquid located at the edge of the base substrate, the solvent evaporation rate of the liquid located in the middle of the base substrate is smaller than that of the solvent located at the edge of the base substrate. Therefore, there is a problem that the thickness of the film coated on the surface of the base substrate after drying is not uniform, and the uniformity of the thickness of the film has an important influence on the display quality of the OLED display. The uneven thickness will affect the brightness, the color and even the lifetime of the OLED display.

In order to improve the thickness uniformity of the obtained film to solve the above problems, the embodiments of the present disclosure provide a film production method and system.

Figure 1:
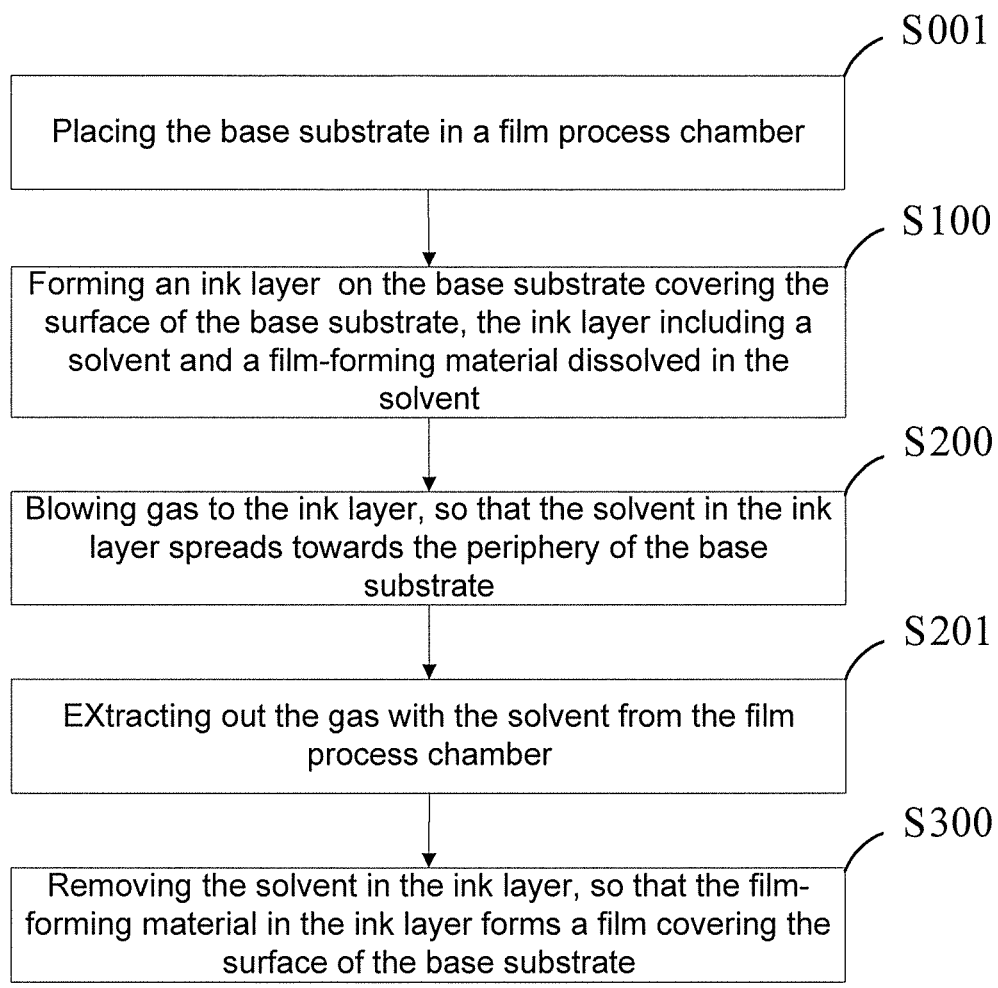
FIG. 1 is a first flowchart of the film production method according to the embodiments of the present disclosure.

Referring to FIG. 1, the film production method provided in the embodiments includes the following steps.

S100: Forming an ink layer on a base substrate covering a surface of the base substrate, the ink layer including a solvent and a film-forming material dissolved in the solvent.

S200: Blowing gas to the ink layer, so that the solvent in the ink layer spreads towards the periphery of the base substrate.

S300: Removing the solvent in the ink layer, so that the film-forming material in the ink layer forms a film covering the surface of the base substrate.

It can be seen from the above specific implementation process that in the film production method provided in this embodiment, the ink layer covering the surface of the base substrate is firstly formed on the base substrate, and then gas is blown to the ink layer, so that the solvent in the ink layer is spread towards the periphery of the base substrate. In this way, it is able to avoid the phenomenon that the ink layer in an area of the surface of the base substrate is surrounded by the ink layer in the surrounding area, so that the evaporation of the solvent in the ink layer in different areas of the base substrate is not hindered, and the evaporation rates of the solvent in the ink layer in different areas of the base substrate surface tend to be consistent, thus ensuring that a film of uniform thickness will be formed on the surface of the base substrate when the solvent evaporation is completed.

In one embodiment of the present disclosure, the viscosity of the ink layer is about 1 cP to 20 cP, such as 1 cP, 3 cP, 7 cP, 10 cP, 15 cP, 17 cP, 19 cP, 20 cP. Within this range, it is possible to ensure that the ink layer has good rheological properties, so that the ink layer can be uniformly spread on the base substrate to help form a film of uniform thickness on the surface of the base substrate. For example, the solvent in the ink layer may be diethylene glycol monobutyl ether in a concentration of 80% to 90%, and the film-forming material may be poly (3,4-ethylenedioxythiophene)-polystyrene sulfonic acid (PEDOT/PSS), polythiophene, polyaniline or polypyrrole, wherein the solvent has a mass fraction of 95% to 98% in the ink layer, for example, 95%, 96%, 97%, 98%. The mass fraction of the film-forming material in the ink layer is 0.5% to 5%, for example 0.5%, 1%, 2%, 3%, 4%, 5%.

For example, the above film can be used as one or more of a hole injection layer, a hole transport layer and an organic light-emitting layer of an OLED. Of course, the film production method provided in the embodiments is also applicable to other film production processes, which is not limited in the embodiments.

Figure 2:
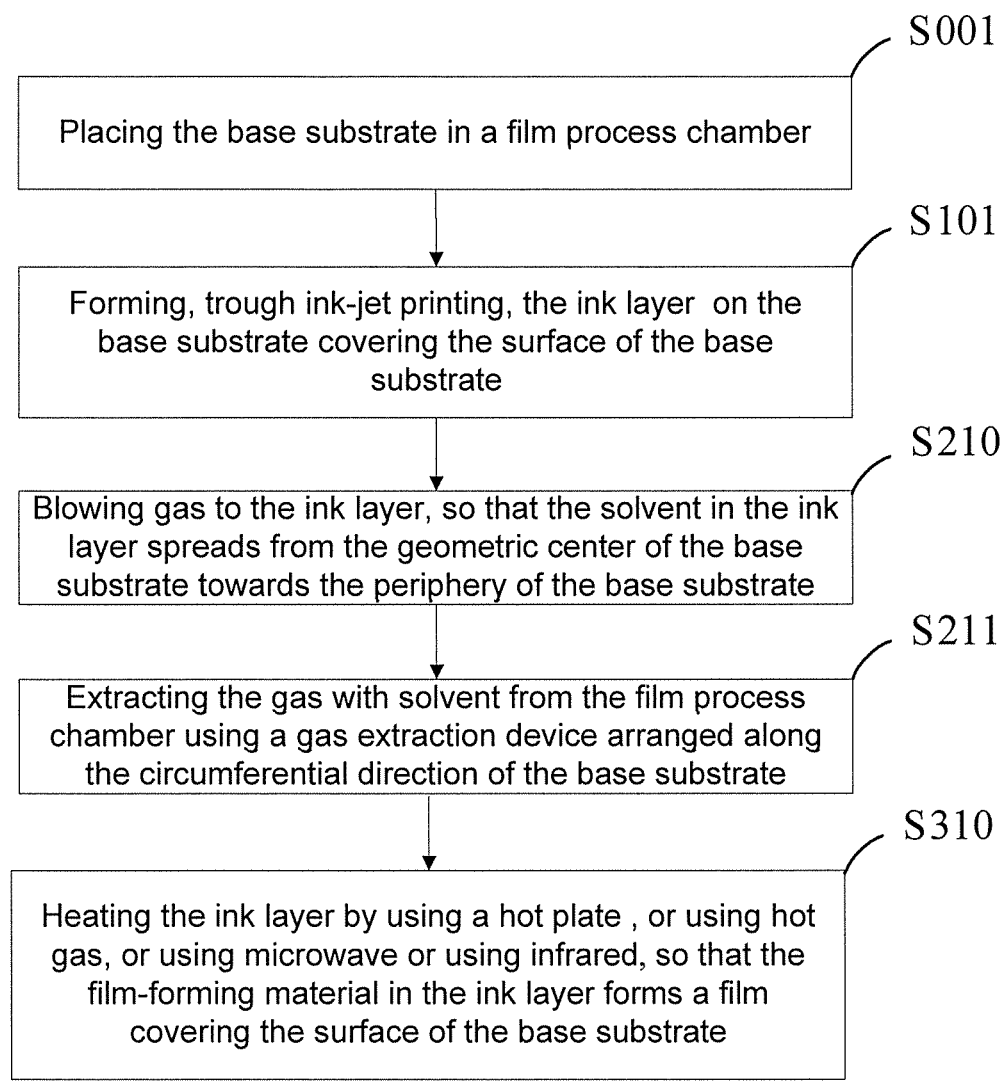
FIG. 2 is a second flowchart of the film production method according to the embodiments of the present disclosure.

In another embodiment of the present disclosure, as shown in FIG. 2, S100, the forming an ink layer on the base substrate covering the surface of the base substrate includes:

S101: forming, through ink-jet printing, the ink layer on the base substrate covering the surface of the base substrate. In this embodiment, the film-forming material is first dissolved in a solvent to form an ink, and then the ink is sprayed on the base substrate by a plurality of nozzles through ink-jet printing. Compared with using the conventional vacuum evaporation method, using the film production method in this embodiment can reduce the waste of the film-forming material and improve the utilization rate of the film-forming material.

In addition, in another embodiment of the present disclosure, S200, the blowing gas to the ink layer so that the solvent in the ink layer spreads towards the periphery of the base substrate includes:

S210: blowing gas to the ink layer, so that the solvent in the ink layer spreads from the geometric center of the base substrate towards the periphery of the base substrate. In the film production method provided in this embodiment, since the solvent in the ink layer is spread from the geometric center of the base substrate, it is ensured that the movements of the solvent in the ink layer in different areas which are located at equal distances from the geometric center of the base substrate are in unison. Thus it is ensured that after the gas blowing is completed, the solvent content of the ink layer on the surface of the base substrate will uniformly decrease from the geometric center of the base substrate being as a center, thereby the removal of solvent in the ink layer in the geometric center area is not hindered while the solvent is being subsequently removed. That is, the evaporation rate of the solvent in the ink layer in the geometrical center area of the base substrate and the evaporation rate of the solvent in the ink layer in the surrounding area tend to be uniform, and thus ensuring the uniformity of the thickness of the film formed on the surface of the base substrate.

In another embodiment of the present disclosure, in the above step of S200, when gas is blown to the ink layer, the gas flow rate is about 0.1 m/s to 10 m/s and the duration time of the gas blowing is about 300 s to about 400 s. In this embodiment, the gas flow rate is controlled between 0.1 m/s and 10 m/s, for example, 0.1 m/s, 1.0 m/s, 3.0 m/s, 5.0 m/s, 7.0 m/s or 10 m/s, so that the solvent in the ink layer can be smoothly spread towards the periphery of the base substrate to avoid the problem of moving the film-forming material in the ink layer together due to the gas flow rate being too high, and also avoid the problem of the solvent is difficult to move due to the gas flow rate being too small. Meanwhile, the film production method provided in this embodiment controls the duration time of the gas blowing to be between 300 s and 400 s, for example, 300 s, 350 s and 400 s, so that the solvent in the ink layer has sufficient time to spread to the periphery of the base substrate, and ensures the volatilization of the solvent in the ink layer in each area of the base substrate is not hindered. Thus, the evaporation rates of the solvent in the ink layer in different areas of the base substrate surface tend to be consistent, and it is able to ensure the uniformity of the thickness of the film formed on the surface of the base substrate.

In another embodiment of the present disclosure, as shown in FIG. 1, before step of the S100 of forming the ink layer on a base substrate covering the surface of the base substrate, the film production method provided by the embodiment further includes:

S001: placing the base substrate in a film process chamber. For example, dry nitrogen or dry air can be fed into the film process chamber to ensure that the ink layer formed on the surface of the base substrate is protected from contact with moisture. This is because in the situation that the film produced by the above process is used as a hole transporting layer of the OLED, moisture will be confined in the hole transporting layer to form non-light-emitting dark spots during subsequent device operation, which results in a deterioration of the display effect of the OLED display device. Therefore, in this embodiment, the inside of the film process chamber is ensured to be a dry environment so as to ensure that the film production process is not in contact with moisture, thereby ensuring the service life of the OLED obtained by using the film.

In another embodiment of the present disclosure, after the step of the S200 of blowing gas to the ink layer so that the solvent in the ink layer spread to a surrounding area of the base substrate, and before the step of the S300 of removing the solvent in the ink layer, the film production method further includes:

S201: extracting the gas with the solvent from the film process chamber. This will result in less solvent in the film process chamber, thereby reducing the amount of solvent to be subsequently removed from the ink layer. In addition, the present embodiment can also reduce the humidity in the film process chamber by extracting the gas with the solvent from the film process chamber, thereby improving the removal efficiency of the solvent during the subsequent removal of the solvent in the ink layer, so that film covering the base substrate surface can be formed quickly.

In another embodiment of the present disclosure, as shown in FIG. 2, the step of the S201 of extracting the gas with the solvent from the film process chamber includes:

S211: extracting the gas with solvent from the film process chamber using a gas extraction device arranged along the circumferential direction of the base substrate In this embodiment, the gas extraction device is arranged along the circumferential direction of the base substrate so that the film-forming material in the ink layer covered on the surface of the base substrate can uniformly spread in the surface of the base substrate surface under the action of the gas extraction device, and after the subsequent step of removing the solvent, the film with a more uniform thickness will be formed on the surface of the base substrate.

In another embodiment of the present disclosure, referring to FIG. 2, the step of the S300 of removing the solvent in the ink layer so that the film-forming material in the ink layer forms a film covering the surface of the base substrate includes:

S310: heating the ink layer by using a hot plate, or using hot gas, or using microwave or using infrared, so that the film-forming material in the ink layer forms a film covering the surface of the base substrate. In this embodiment, the ink layer is heated by the hot plate, the ink layer is heated by the hot gas, the ink layer is heated by the microwave or the ink layer is heated by the infrared, so that the solvent in the ink layer is volatilized and the film-forming material in the ink layer forms a film covering the surface of the base substrate. For example, the heating temperature may be maintained at 20° C. to 60° C., such as 20□, 30□, 40□, 50□, 60□. In addition, in order to improve the volatilization efficiency of the solvent, in the process of the step S310, the film process chamber may be continuously evacuated to extract the gas generated by volatilization of the solvent during heating in time. For example, after heating, the pressure in the film process chamber can be maintained at about $10^{-6}$ torr.

Figure 3:
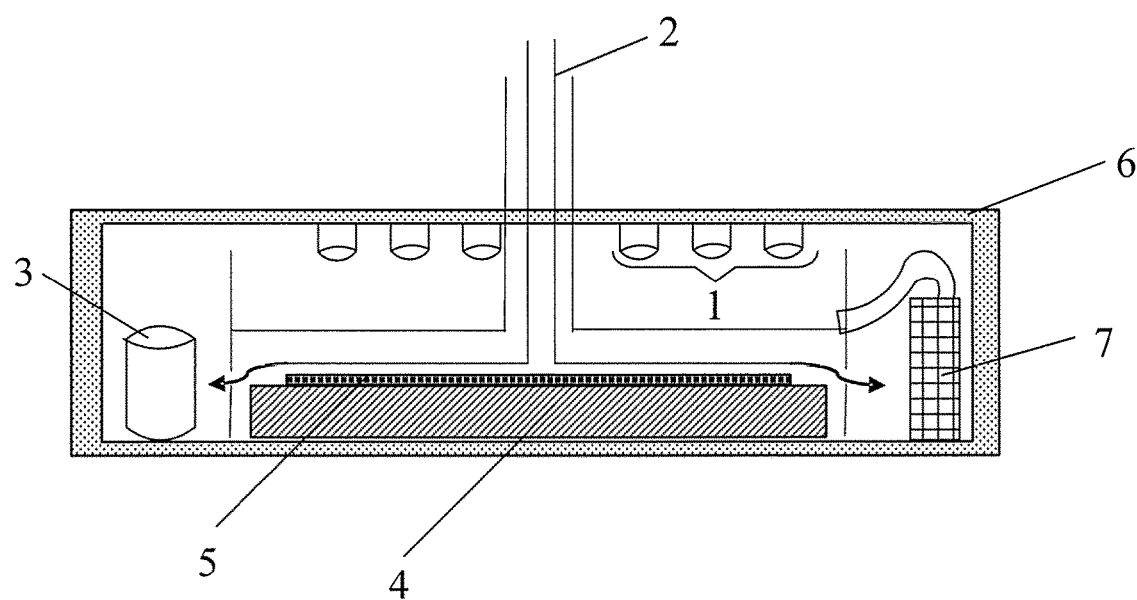
FIG. 3 is a schematic diagram of the film production system according to the embodiments of the present disclosure.

As shown in FIG. 3, an embodiment of the present disclosure provides a film production system including a printing device 1, a gas blowing device 2 and a drying device 3, wherein the printing device 1 is used to form the ink layer 5 on the base substrate 4 covering the surface of the base substrate 4. The ink layer 5 includes the solvent and the film-forming material dissolved in the solvent.

The gas blowing device 2 is used for blowing gas to the ink layer 5, so that the solvent in the ink layer 5 spreads towards the periphery of the base substrate 4.

The drying device 3 is used to remove the solvent in the ink layer 5, so that the film-forming material in the ink layer 5 forms the film covering the surface of the base substrate 4.

In practice, the printing device 1 is used to form the ink layer 5 on the base substrate 4 covering the surface of the base substrate 4, and the gas blowing device 2 is used to blow the gas to the ink layer 5 so that the solvent in the ink layer 5 spreads towards the periphery of the base substrate 4. Then, drying device 3 is used to remove the solvent in the ink layer 5 so that the film-forming material in the ink layer 5 forms the film covering the surface of the base substrate 4.

The beneficial effects of the film production system provided in this embodiment are the same as those of the film production method provided in the foregoing embodiments, and details are not described herein again.

It is understandable that, the printing device 1 can be an inkjet printing device, and the drying device can include one or a combination of two or more of the hot plate heating device, the hot gas heating device, the microwave heating device and the infrared heating device. In the situation that the printing device 1 is the ink jet printing device, the film forming material is dissolved in a solvent to form an ink firstly, and then the ink is sprayed on the base substrate 4 by using a plurality of nozzles of the ink jet printing device. Compared with using the traditional vacuum evaporation apparatus, using the ink jet printing device can reduce the waste of the film-forming material and improve the utilization rate of the film-forming material. In the situation that the drying device 3 heats the ink layer 5 using one or two of the hot plate heating device, the hot gas heating device, the microwave heating device and the infrared heating device, the solvent in the ink layer 5 can evaporate quickly which will help the quick formation of the film on the surface of the base substrate 4.

In another embodiment of the present disclosure, as shown in FIG. 3, the film production system may further include a film process chamber 6 and a gas extraction device 7. For example, the gas extraction device 7 is a vacuum pump. The gas extraction device 7 and the base substrate 4 are located in the film process chamber 6. The gas extraction device 7 is arranged along the circumferential direction of the base substrate 4 and the gas extraction device 7 is used to extracting the gas with the solvent from the film process chamber 6. In the present embodiment, the gas extraction device 7 is arranged along the circumferential direction of the base substrate 4 so that the film-forming material in the ink layer 5 covering the surface of the base substrate 4 can uniformly spread in the surface of the base substrate 4 under the action of the gas extraction device 7, and after the subsequent step of removing the solvent, the film with a more uniform thickness will be formed on the surface of the base substrate 4.

In the above description of the embodiments, particular features, structures, materials, or characteristics may be combined in any suitable manner in any one or more of the embodiments or examples.

The above descriptions are merely specific embodiments of the present disclosure, but the protection scope of the present disclosure is not limited thereto. Anyone skilled in the art may easily conceive changes and substitutions within the technical scope disclosed in the present disclosure, the changes and substitutions should be covered by the scope of the present disclosure. Therefore, the protection scope of the present disclosure should be based on the protection scope of the claims.

What is claimed is:

1. A film production method, comprising:
   forming an ink layer on a base substrate covering a surface of the base substrate, the ink layer including a solvent and a film-forming material dissolved in the solvent, wherein the solvent in the ink layer is diethylene glycol monobutyl ether in a concentration of 80% to 90%, the film-forming material is poly (3,4-ethylenedioxythiophene)-polystyrene sulfonic acid (PEDOT/PSS), polythiophene, polyaniline or polypyrrole, the solvent has a mass fraction of 95% to 98% in the ink layer, and the viscosity of the ink layer is about 1 cP to 20 cP;
   blowing gas to the ink layer, so that the solvent in the ink layer spreads from the geometric center of the base substrate towards the periphery of the base substrate, when blowing gas to the ink layer, the gas flow rate is about 0.1 m/s to 10 m/s, and the duration time of the gas blowing is about 300 s to 400 s; and
   removing the solvent in the ink layer, so that the film-forming material in the ink layer forms a film covering the surface of the base substrate.

2. The film production method according to claim 1, wherein, the forming an ink layer on the base substrate covering the surface of the base substrate comprises: forming, through ink-jet printing, the ink layer on the base substrate covering the surface of the base substrate.

3. The film production method according to claim 1, wherein, the film production method, before the forming an ink layer on the base substrate covering the surface of the base substrate, further comprises:
   placing the base substrate in a film process chamber;
   the film production method, after blowing gas to the ink layer so that the solvent in the ink layer spreads towards the periphery of the base substrate, and before removing the solvent in the ink layer, further comprises:
   extracting the gas with the solvent from the film process chamber.

4. The film production method according to claim 3, wherein, the extracting the gas with the solvent from the film process chamber comprises:
   extracting the gas with solvent from the film process chamber using a gas extraction device arranged along the circumferential direction of the base substrate.

5. The film production method according to claim 1, wherein, the removing the solvent in the ink layer so that the film-forming material in the ink layer forms a film covering the surface of the base substrate comprises:
   heating the ink layer by using a hot plate, or using hot gas, or using microwave or using infrared, so that the film-forming material in the ink layer forms a film covering the surface of the base substrate.

6. A film production system for carrying out the film production method of claim 1, comprising a printing device, a gas blowing device and a drying device, wherein,
   the printing device is configured to form the ink layer on the base substrate covering the surface of the base substrate, the ink layer comprising the solvent and the film-forming material dissolved in the solvent;
   the gas blowing device is configured to blow gas to the ink layer, so that the solvent in the ink layer spreads from the geometric center of the base substrate towards the periphery of the base substrate;
   the drying device is configured to remove the solvent in the ink layer, so that the film-forming material in the ink layer forms the film covering the surface of the base substrate.

7. The film production system according to claim 6, wherein, the printing device is an inkjet printing device.

8. The film production system according to claim 6, wherein, the drying device comprises one or a combination of two or more of a hot plate heating device, a hot gas heating device, a microwave heating device and an infrared heating device.

9. The film production system according to claim 6, wherein, the film production system further comprises a film process chamber and a gas extraction device, the gas extraction device and the base substrate are located in the film process chamber, and the gas extraction device is arranged along the circumferential direction of the base substrate and configured to extract the gas with solvent in the film process chamber.

10. The film production system according to claim 9, wherein, the gas extraction device is a vacuum pump.

* * * * *